United States Patent [19]

Choi

[11] Patent Number: 5,466,640
[45] Date of Patent: Nov. 14, 1995

[54] METHOD FOR FORMING A METAL WIRE OF A SEMICONDUCTOR DEVICE

[75] Inventor: Yang K. Choi, Seoul, Rep. of Korea

[73] Assignee: Hyundai Electronics Industries Co., Ltd., Kyungki-Do, Rep. of Korea

[21] Appl. No.: 388,685

[22] Filed: Feb. 15, 1995

[30] Foreign Application Priority Data

Feb. 15, 1994 [KR] Rep. of Korea .................. 94-2578

[51] Int. Cl.$^6$ ............................................. H01L 21/3205
[52] U.S. Cl. ............... 437/195; 437/245; 148/DIG. 102; 148/DIG. 106
[58] Field of Search .................................. 437/195, 245, 437/246, 229, 235, 241; 148/DIG. 106, DIG. 102, DIG. 137

[56] References Cited

U.S. PATENT DOCUMENTS 4,484,978 11/1984 Keyser.
4,996,133 2/1991 Brighton et al..
5,420,078 5/1995 Sikora ............................. 437/228

FOREIGN PATENT DOCUMENTS 4-129226 4/1992 Japan.

*Primary Examiner*—Olik Chaudhuri
*Assistant Examiner*—C. Everhart
*Attorney, Agent, or Firm*—Fish & Richardson

[57] ABSTRACT

The object of the present invention is to prevent the electrical short between the adjacent metal wires by forming metal wires alternately between insulation films and to improve the process margin in the lithography process and the etching process.

The present invention alternately forms a plurality of metal wires between the insulation films by manufacturing the photomask for metal wires in two separate pieces to correspond to the photomask for general metal wires for forming a plurality of metal wires which are densely constituted, and by utilizing the two photomasks.

12 Claims, 4 Drawing Sheets

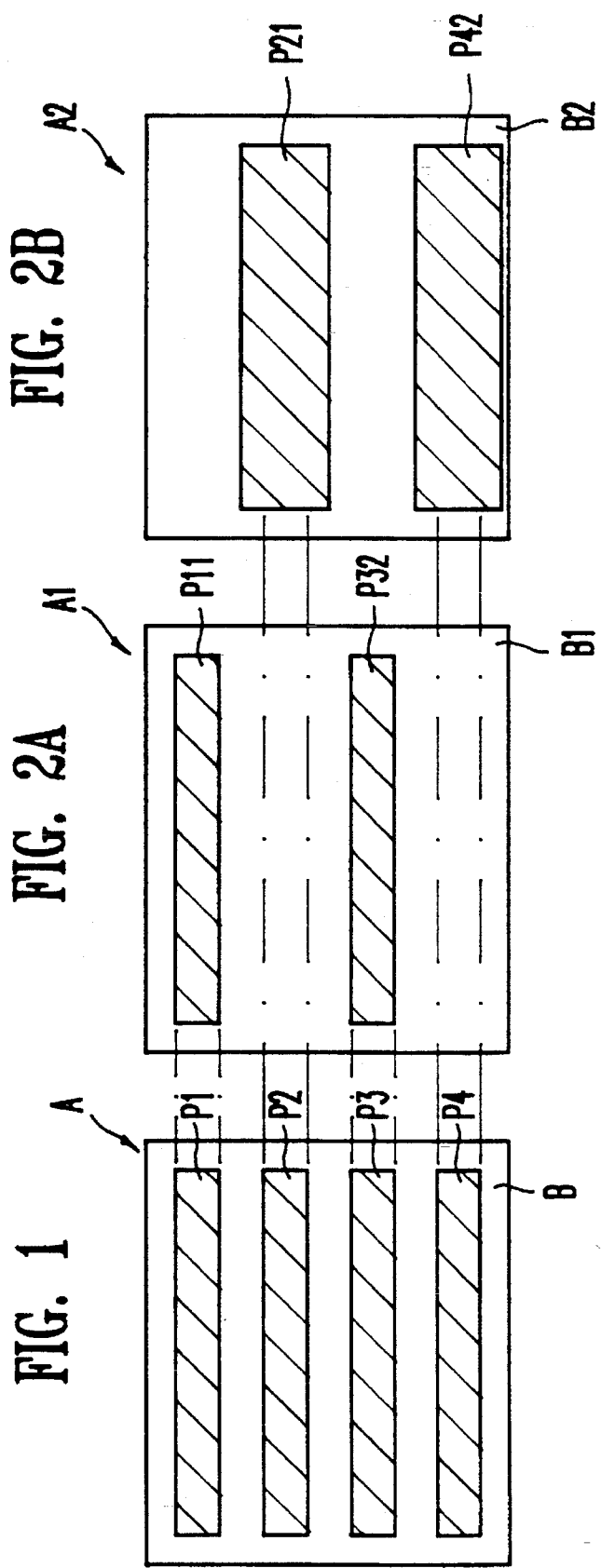

METHOD FOR FORMING A METAL WIRE OF A SEMICONDUCTOR DEVICE

BACKGROUND OF INVENTION

1. Field of Invention

The present invention relates to a method for forming a metal wire of a semiconductor device, and in particular, to a method for alternately forming a plurality of metal wires between insulation films, to prevent electrical short between adjacent metal wires and to improve process margin in a lithography process and an etching process.

2. Information Disclosure Statement

In general, the metal wire has a role of electrically connecting a cell and a peripheral circuit in all semiconductor devices, however, it is difficult to form a metal wire of a preferable profile due to difference in topology between the cell and the peripheral circuit. In particular, as the semiconductor is more densely integrated, it is more difficult to form the metal wire of the preferable profile.

FIG. 1 is a plane view of a conventional photomask used for forming dense metal wires.

The photomask A is manufactured by forming a first, second, third and fourth Chrome pattern P1, P2, P3 and P4 on a quartz substrate B. To form the metal wire to a maximum degree of density, it is preferable to form the width of each pattern of the first, second, third and fourth Chrome patterns P1, P2, P3 and P4 and the width of space between the patterns to be the same.

In case where the photomask A having the above described construction is manufactured to correspond to a stepper (not shown) which can form a minimum pattern width of 0.35 µm, it is possible to form metal wires of preferable profile having the width of 0.35 µm in a flat plate having no difference in the topology, however, a problem occurs with plates having difference in the topology in that the electrical short occurs between the adjacent metal wires because the profile of the metal wires become aggravated.

Therefore, an object of the present invention is to provide the method for forming a metal wires of a semiconductor device which can prevent the electrical short between the adjacent metal wires by alternately forming metal wires between insulation films.

Other object of the present invention is to improve the process margin in the lithography process and the etching process by utilizing two photomasks which correspond to a conventional photomask for metal wire.

SUMMARY OF THE INVENTION

A method for forming a metal wire of a semiconductor device according to the present invention for achieving the above objects and other advantages is comprised the following process:

forming a first insulation film which electrically insulates elements on a wafer, and forming an etching barrier layer on said first insulation film;

sequentially forming second and third insulation films having different wet etching selection ratios on said etching barrier layer;

coating a negative photoresist film on said third insulation film, and opening the portions of said negative photoresist film corresponding to the portions, where lower metal wires are to be formed, by the lithography process utilizing a first photomask in which Chrome patterns are formed to correspond to portions where said lower metal wires are to be formed;

forming a plurality of trenches by sequentially etching said third and second insulation films until said etching barrier layer is exposed by an anisotropic etching process utilizing said negative photoresist film having opened portions;

removing said negative photoresist film, and forming undercuts in said trenches by selectively horizontally etching said second insulation film consisting inner walls of said plurality of trenches to a predetermined depth with reference to said etching stop layer and said third insulation film;

depositing conductor on said third insulation film including said trenches in which said undercuts are formed;

coating a positive photoresist film on said conductor, and leaving the portions of said positive photoresist film corresponding to the portions, where upper metal wires are to be formed, in the form of patterns by the lithography process utilizing a second photomask in which Chrome patterns are formed to correspond to portions where said upper metal wires are to be formed; and forming said upper metal wires on said third insulation film and said lower metal wires of said metal wire on the portions of said undercut of said trenches by over etching said conductors up to the upper part of the undercut of said trenches by the anisotropic etching process utilizing the patterned positive photoresist film, whereby said metal wires are alternately formed on different levels having the third insulation film between said metal wire.

BRIEF DESCRIPTION OF THE DRAWINGS

For a full understanding of the nature and objects of the invention, reference should be had to the following detailed description taken in conjunction with the accompanying drawings in which:

FIG. 1 is a plan view of a conventional general photomask used for forming dense metal wires;

FIGS. 2A and 2B are plan views of photomasks of the present invention used for forming dense metal wires.

Similar references characters refer to similar parts through the several view of the drawings.

DETAILED DESCRIPTION OF THE INVENTION

FIGS. 2A and 2B are plane views of photomasks of the present invention used for forming dense metal wires.

A first photomask A1 shown in FIG. 2A and a second photomask A2 shown in FIG. 2B are manufactured to correspond to a conventional photomask A shown in FIG. 1.

The first photomask A1 is manufactured by forming a first and second Chrome patterns P11 and P32 on a quartz substrate In case of superposing the first photomask A1 and the conventional photomask A, the first Chrome pattern P11 of the first photomask A1 is superposed onto the first Chrome pattern P1 of the conventional photomask A with the two patterns P11 and P1 having the same width, and the second Chrome pattern P32 of the first photomask A1 is superposed onto the third Chrome pattern P3 of the general photomask A with the two patterns P32 and P3 having the same width. Eventually, the first photomask A1 has an advantage in that the process margin is improved in the lithography process and etching process by increasing the design rule relative to the conventional photomask A.

The second photomask A2 is manufactured by forming a first and second Chrome patterns P21 and P42 on a quartz substrate B2. In case of superposing the second photomask A2 and the conventional photomask A, the first Chrome pattern P21 of the second photomask A2 is superposed onto the second Chrome pattern P2 of the conventional photomask A with the Chrome pattern P21 having the width of about twice that of the Chrome pattern P2, the second Chrome pattern P42 of the second photomask A2 is superposed onto the fourth Chrome pattern P4 of the conventional photomask A with the Chrome pattern P42 having the width of about twice that of the Chrome pattern P4. Eventually, the second photomask A2 has an advantage in that the process margin is improved in the lithography process and etching process by increasing the design rule relative to the conventional photomask A.

FIGS. 3A to 3G are sectional views illustrating the steps for forming metal wires of the semiconductor device of the present invention by utilizing the first and second photomask and A2.

Figure 3A:
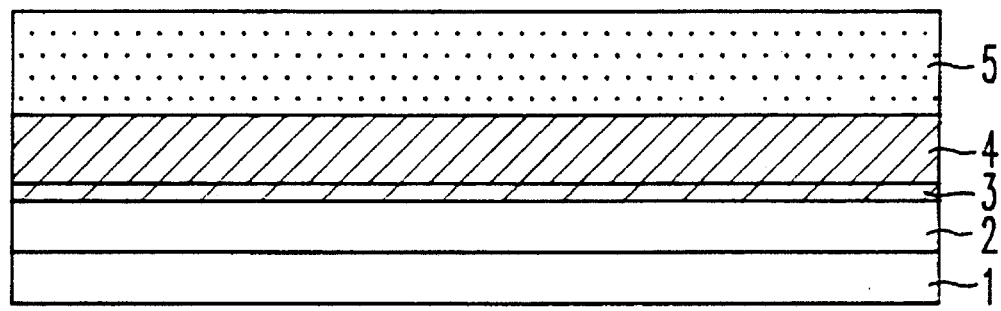
FIGS. 3A to 3G are sectional views illustrating the method for forming metal wires of the semiconductor device of the present invention.

Referring to FIG. 3A, a first insulation film 2 is formed on a wafer 1. An etching barrier layer 3 is thinly formed on the first insulation film 2. A second insulation film 4 and a third insulation film 5 are sequentially formed on the etching barrier layer 3.

The first insulation film 2 is formed by depositing oxides such as BPSG (Boron Phosphorous Silicate Glass), etc. for electrical insulation between elements and for surface flattening after forming elements such as transistors, etc. on the wafer 1. The etching barrier layer 3 is formed with nitride to prevent the first insulation film 2 from being etched at the time of etching the second and third insulation films 4 and 5.

The second insulation film 4 and the third insulation film 5 are formed with materials having different wet etching selection ratios. The second insulation film 4 is formed with oxides doped with impurities, and the third insulation film 5 is formed with oxides undoped with impurities. Oxides doped with impurities have higher wet etching selection ratio than oxides undoped with impurities.

On the other hand, in case of concurrently performing the surface flattening process at the time of process of forming the second insulation film 4, the second insulation film 4 is formed to have varying thickness at portions, where the difference in topology is severe, such as the cell area and the peripheral circuit area. That is, the thickness of the second insulation film 4 is formed to be thin on the cell area where the topology is high, and is formed to be thick on the peripheral circuit area where the topology is low. The thickness of the second insulation film 4 decides the thickness of a lower metal wire which will be subsequently formed. If the thickness of the lower metal wire is to be maintained constant in all areas, the process of surface flattening of the second insulation film 4 shall not be performed. In case of concurrently performing the surface flattening process at the time of process of forming the second and third insulating films 4 and 5, the difference in topology between the cell and the peripheral circuit can be minimized so that the subsequent process can be made easy.

The thickness of the third insulation film 5 is preferably formed to be about 50% thick than thickness of conductor deposit considering an over etching at the time of process of etching conductor to form the upper and lower metal wires.

Figure 3B:
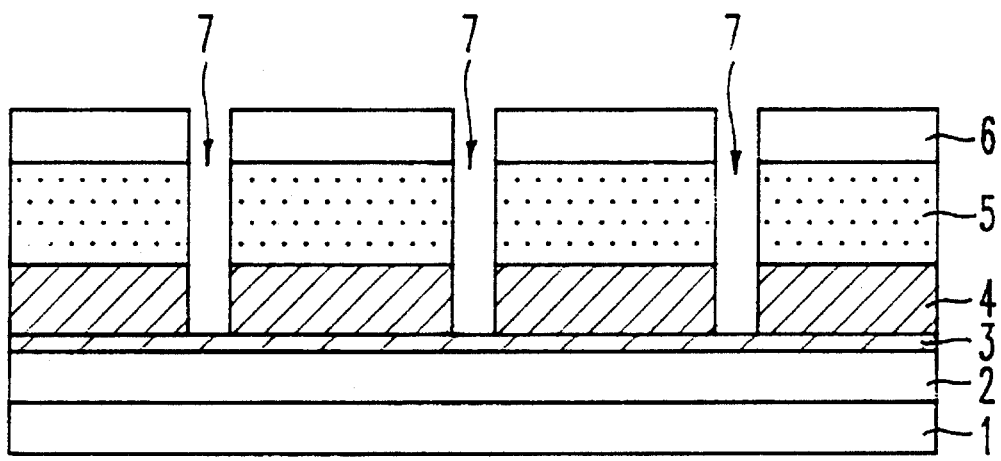

Referring to FIG. 3B, a negative photoresist film 6 is coated on the third insulation film 5. Portions of the negative photoresist film 6 corresponding to light interruption portions are opened by the lithography process utilizing the first photomask A1 shown in FIG. 2A. The opened portions of the negative photoresist film 6 are portions where the lower metal wires of the first metal wires are to be formed. Trenches 7 are formed by sequentially vertically etching the third insulation film 5 and the second insulation film 4 by an anisotropic etching process utilizing the negative photoresist film 6 having the opened portions until the etching barrier layer 3 is exposed.

Figure 3C:
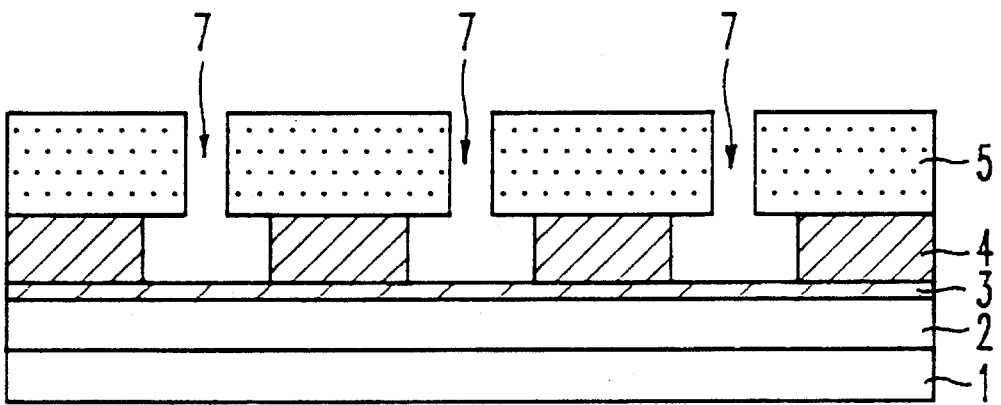

FIG. 3C shows a condition in which undercuts are formed in the trenches 7 by selectively horizontally etching the second insulation film 4 consisting inner walls of the trenches 7 to a predetermined depth with reference to the etching barrier layer 3 and the third insulation film 5 by utilizing an isotropic etching process, after removing the negative photoresist film 6.

Forming the undercut in the trenches 7 is to lower a surface resistance value by widening the width of the lower metal wires of the first metal wires, and if the surface resistance value is not critical, the process of forming the undercut can be omitted.

Figure 3D:
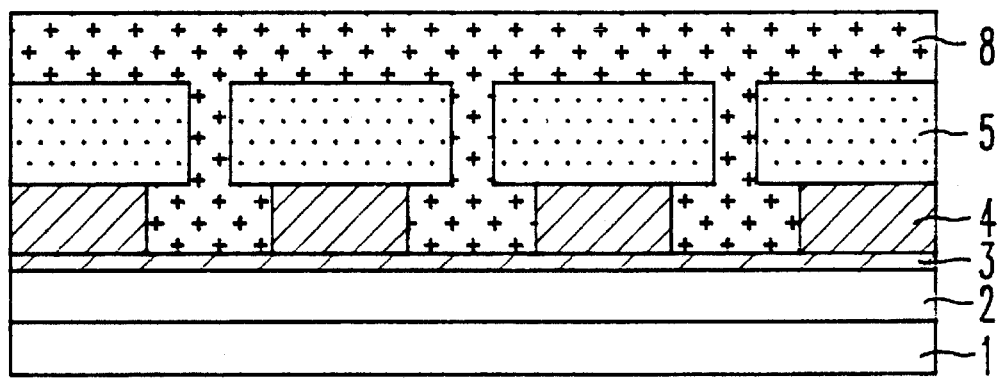

FIG. 3D shows a condition in which conductor 8 is thickly deposited for the first metal wire on the third insulation film 5 which includes the trenches 7 in which the undercuts are formed. The conductor 8 is preferably made of a material having a superior step coverage such as Tungsten W.

Figure 3E:
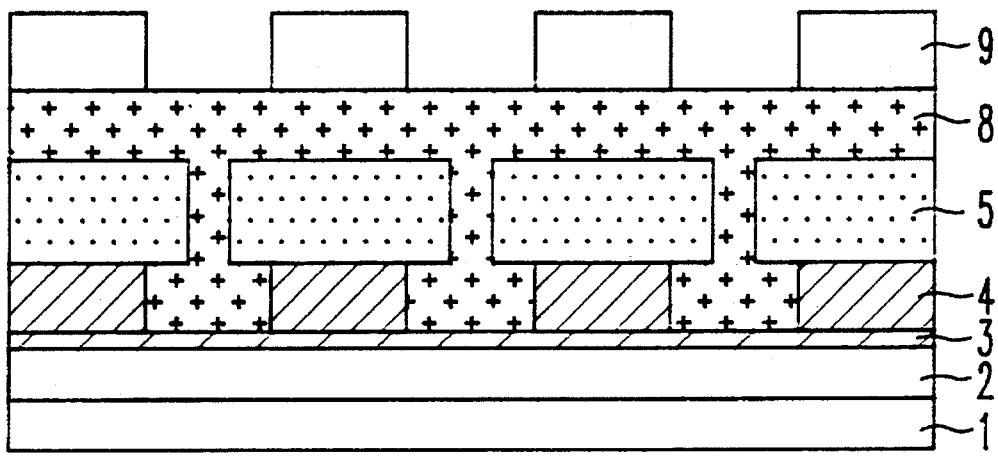

Referring to FIG. 3E, a positive photoresist film 9 is coated on the conductor 8. Portions of the positive photoresist film 9 corresponding to light interruption portions are left in the form of patterns by the lithography process utilizing the second photomask A2 shown in FIG. 2B. The pattern portions of the positive photoresist film 9 are portions where upper metal wires of the first metal wires are to be formed.

Figure 3F:
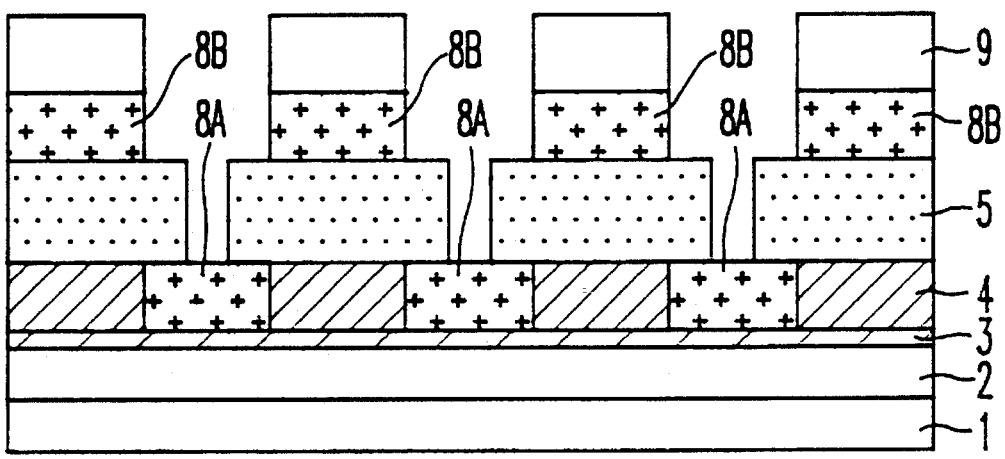

FIG. 3F shows a condition in which the upper metal wires 8B and the lower metal wires 8A of the first metal wires are formed by over etching the conductor 8 up to the upper part of the undercut of the trenches 7 by the anisotropic etching process utilizing the patterned positive photoresist film 9.

It can be understood that the first metal wires are alternately formed having the third insulation film 5 between the first metal wires differently from the prior art.

Figure 3G:
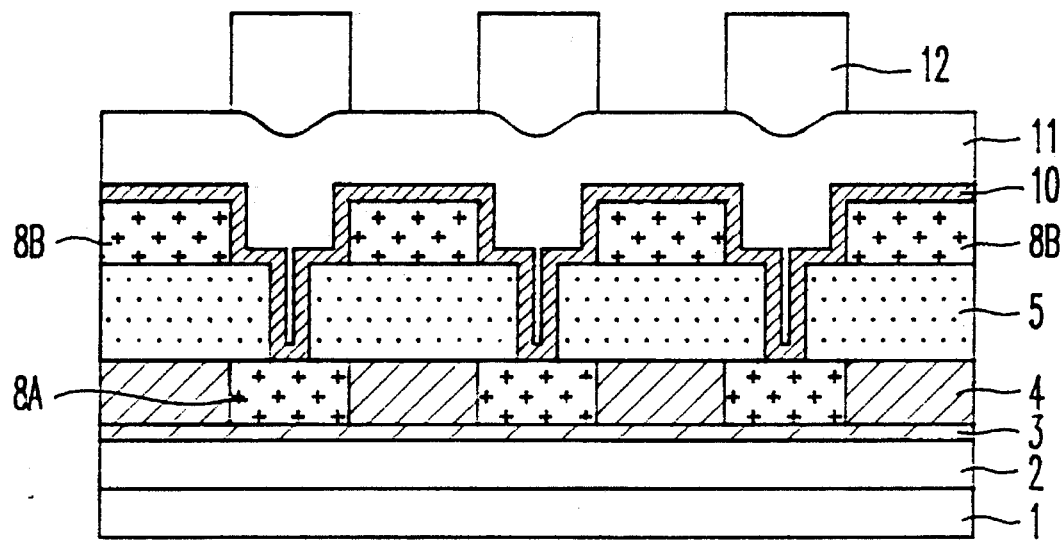

FIG. 3G shows a condition in which the patterned positive photoresist film 9 is removed, the fourth insulation film 10 and the fifth insulation film 11 are sequentially formed and flattened with a conventional method, and the second metal wires 12 are formed at predetermined portions of the upper part of the flattened fifth insulation film 11.

The present invention alternately forms a plurality of metal wires between the insulation films by manufacturing the photomask for metal wires in two separate pieces to correspond to the photomask for conventional metal wires for forming a plurality of metal wires which are densely constituted, and by utilizing the photomask. Therefore, the process margin at the lithography process and the etching process is improved so that the electrical short between the metal wires can be prevented and the yield and reliability of the semiconductor device can be improved.

Although this invention has been described in its preferred form with a certain degree of particularity, those skilled in the art can readily appreciate that the present disclosure of the preferred form has been made only by way of example and that numerous changes in the details of the construction, combination and arrangement of parts may be resorted to without departing from the spirit and scope of the invention.

What is claimed is:

1. A method for forming a metal wire of a semiconductor device, comprising the steps of;

forming a first insulation film which electrically insulates elements on a wafer, and forming an etching barrier layer on said first insulation film;

sequentially forming second and third insulation films having different wet etching selection ratios on said etching barrier layer;

coating a negative photoresist film on said third insulation film, and opening the portions of said negative photoresist film corresponding to the portions, where lower metal wires are to be formed, by the lithography process utilizing a first photomask in which Chrome patterns are formed to correspond to portions where said lower metal wires are to be formed;

forming a plurality of trenches by sequentially etching said third and second insulation films until said etching barrier layer is exposed by an anisotropic etching process utilizing said negative photoresist film having opened portions;

removing said negative photoresist film, and forming undercuts in said trenches by selectively horizontally etching said second insulation film consisting inner walls of said plurality of trenches to a predetermined depth with reference to said etching stop layer and said third insulation film;

depositing conductor on said third insulation film including said trenches in which said undercuts are formed;

coating a positive photoresist film on said conductor, and leaving the portions of said positive photoresist film corresponding to the portions, where upper metal wires are to be formed, in the form of patterns by the lithography process utilizing a second photomask in which Chrome patterns are formed to correspond to portions where said upper metal wires are to be formed; and forming said upper metal wires on said third insulation film and said lower metal wires of said metal wire on the portions of said undercut of said trenches by over etching said conductors up to the upper part of the undercut of said trenches by the anisotropic etching process utilizing the patterned positive photoresist film, whereby said metal wires are alternately formed on different levels having the third insulation film between said metal wires.

2. The method as claimed in claim 1, wherein said etching barrier layer is formed on a material having etching selection ratio different from said second and third insulation films.

3. The method as claimed in claim 1, wherein said etching barrier layer is formed of a nitride.

4. The method as claimed in claim 1, wherein said second insulation film is formed of an oxide doped with impurities.

5. The method as claimed in claim 1, wherein said third insulation film is formed of an oxide undoped with impurities.

6. The method as claimed in claim 1, wherein said conductor is made of Tungsten.

7. A method for forming a metal wire of a semiconductor device, comprising the steps of;

forming a first insulation film which electrically insulates elements on a wafer, and forming an etching barrier layer on said first insulation film;

sequentially forming second and third insulation films having different wet etching selection ratios on said etching barrier layer;

coating a negative photoresist film on said third insulation film, and opening the portions of said negative photoresist film corresponding to the portions, where lower metal wires are to be formed, by the lithography process utilizing a first photomask in which Chrome patterns are formed to correspond to portions where said lower metal wires are to be formed;

forming a plurality of trenches by sequentially etching said third and second insulation films until said etching barrier layer is exposed by an anisotropic etching process utilizing said negative photoresist film having opened portions;

removing said negative photoresist film, depositing conductor on said third insulation film including said trenches;

coating a positive photoresist film on said conductor, and leaving the portions of said positive photoresist film corresponding to the portions, where upper metal wires are to be formed, in the form of patterns by the lithography process utilizing a second photomask in which Chrome patterns are formed to correspond to portions where said upper metal wires are to be formed; and forming said upper metal wires on said third insulation film and said lower metal wires of said metal wire in said trenches by over etching said conductors up to the upper part of the undercut of said trenches by the anisotropic etching process utilizing the patterned positive photoresist film, whereby said metal wires are alternately formed on different having the third insulation film between said metal wires.

8. The method as claimed in claim 7, wherein said etching barrier layer is formed on a material having etching selection ratio different from said second and third insulation films.

9. The method as claimed in claim 7, wherein said etching barrier layer is formed of a nitride.

10. The method as claimed in claim 7, wherein said second insulation film is formed of an oxide doped with impurities.

11. The method as claimed in claim 7, wherein said third insulation film is formed of an oxide undoped with impurities.

12. The method as claimed in claim 7, wherein said conductor is made of Tungsten.

* * * * *